United States Patent
Yamaguchi et al.

[11] Patent Number: 5,874,768
[45] Date of Patent: Feb. 23, 1999

[54] SEMICONDUCTOR DEVICE HAVING A HIGH BREAKDOWN VOLTAGE

[75] Inventors: Hitoshi Yamaguchi; Hiroaki Himi, both of Nagoya; Seiji Fujino, Toyota, all of Japan

[73] Assignee: Nippondenso Co., Ltd., Kariya, Japan

[21] Appl. No.: 965,775

[22] Filed: Nov. 7, 1997

Related U.S. Application Data

[63] Continuation of Ser. No. 490,543, Jun. 14, 1995, abandoned.

[30] Foreign Application Priority Data

Jun. 15, 1994 [JP] Japan .................................... 6-132995

[51] Int. Cl.$^6$ .................................................. H01L 29/36
[52] U.S. Cl. .......................... 257/493; 257/492; 257/339; 257/350; 257/656
[58] Field of Search ..................................... 257/487, 491, 257/492, 493, 339, 353, 354, 914, 523, 524, 656, 350

[56] References Cited

U.S. PATENT DOCUMENTS

| | | | |
|---|---|---|---|
| 4,242,697 | 12/1980 | Berthold et al. | 257/491 |
| 4,593,458 | 6/1986 | Alder | 257/492 |
| 5,241,210 | 8/1993 | Nakagawa et al. | 257/487 |
| 5,434,444 | 7/1995 | Nakagawa et al. | 257/487 |

FOREIGN PATENT DOCUMENTS

| | | |
|---|---|---|
| 50-39995 | 12/1975 | Japan . |
| 59-24550 | 6/1984 | Japan . |
| 2-16751 | 1/1990 | Japan . |

OTHER PUBLICATIONS

Pierret, Robert F.; "Semiconductor Fundamentals," vol. 1, 2nd Ed., 1988, p. 71.

T. Matsudai, et al. "Simulation of a 700 V High–Voltage Device Structure on a Thin SOI", Proceedings of 1992 International Symposium on Power Semiconductor Devices & IC's, Tokyo, pp. 272–277.

*Primary Examiner*—John F. Guay
*Attorney, Agent, or Firm*—Pillsbury Madison & Sutro LLP

[57] ABSTRACT

A high breakdown voltage semiconductor device formed in an SOI structure is disclosed. An MOS transistor composed of a drift layer, p well, a source, a gate, and a drain is formed in an island region surrounded by insulators on a semiconductor substrate. Furthermore, an electricfield-alleviating layer is formed in a bottom portion of the Si island region. The electric-field-alleviating layer is a semiconductor layer of exceeding low concentration, e.g., intrinsic, and therefore a virtual PIN structure is structured among the p well and the drift layer. Because the electric-field-alleviating layer corresponds to an I layer of the PIN structure, a depletion layer is created within the electric-field-alleviating layer when high voltage is applied to the MOS transistor, the high voltage is distributed throughout this depletion layer, and high breakdown voltage can be obtained.

39 Claims, 6 Drawing Sheets

SEMICONDUCTOR DEVICE HAVING A HIGH BREAKDOWN VOLTAGE

This is a continuation of application Ser. No. 08/490,543, filed on Jun. 14, 1995, which was abandoned upon the filing hereof.

CROSS REFERENCE TO RELATED APPLICATION

This application is based upon and claims the benefit of priority of the prior Japanese Patent application No. 6-132995 filed on Jun. 15, 1994, the contents of which are incorporated herein by reference.

BACKGROUND OF THE INVENTION

1. Field of the Invention

The present invention relates to a semiconductor device to allow high breakdown voltage in semiconductor elements formed in an element region of island configuration, and a method of fabricating same. The semiconductor device according to the present invention can be applied in an IC for drive use having a plurality of high-voltage output stages employed for example in a flat-panel display, and in particular an electroluminescence (EL) display or the like.

2. Related Arts

Conventionally, as shown in FIG. 7, a device which forms a thick oxide film 20 (LOCOS oxide film) between a gate and drain to alleviate an electric field between the gate and drain exists as a device to cause the breakdown voltage of an element in an MOS transistor to increase.

FIG. 8 indicates a case where this device has a SOI (silicon on insulator) structure, i.e., an element structure of isolating type. Herein, when a high voltage of positive polarity is applied to a drain side of an n-channel MOS transistor, equipotential lines expand and an electric-field-alleviating effect due to a buried oxide film 21 appears, as indicated in the right-hand portion of the drawing; In contrast to the left-hand portion of the drawing in which high voltage of negative polarity is applied to a source side, equipotential lines become dense and an electric field is concentrated at a pn-junction interface proximately to the source due to a relationship of potential differential with a Si substrate 22, and a problem occurs in which required breakdown voltage cannot be obtained.

Additionally, a device which disposes an electric-field-alleviating layer of low concentration (but of higher concentration than the SOI layer thereabove) below an SOI layer has been disclosed in Japanese Patent Application Laid-open No. 1-103851 Patent Gazette as electric-field alleviation of this type. Namely, according to this device, a portion of the voltage applied to an element is effectively allotted to a buried oxide film by causing a portion of high voltage of reversed direction to be allotted to the electric-field-alleviating layer, so as to achieve high breakdown voltage.

When this device is applied in the above-described structure, as shown in FIG. 9, the electric field is alleviated by widening the depletion layer in the electric-field-alleviating layer 23. Thus, the electric field concentration at the pn-junction interface proximate to the source is eliminated, and the required breakdown voltage can be obtained, even where a high voltage of negative polarity is applied to the source side.

However, it is necessary to form the electric-field-alleviating layer 23 with a conductivity type opposite the n$^-$ layer thereabove. This is because if it were made to be of the same conductivity type, the structure would be similar to the device depicted in FIG. 8, and there would be no widening of the depletion layer at the electric-field-alleviating layer 23, thus failing to achieve the desired electric-field-alleviating effect. Consequently, a restriction is created in that a p-type electric-field-alleviating layer must be provided in an n-channel MOS transistor, and that an n-type electric-field-alleviating layer must be provided in a p-channel MOS transistor.

However, where it is necessary to form n-channel MOS transistors and p-channel MOS transistors on the same semiconductor substrate, a problem occurs in that different electric-field-alleviating layers must be provided in each of these element regions, due to this restriction.

SUMMARY OF THE INVENTION

In light of the foregoing problem, it is an object of the present invention to function as an electric-field-alleviating layer and be able to allow high breakdown voltage when forming a semiconductor element in a semiconductor-element structure of isolating type, irrespective of whether the semiconductor element is of n type or p type.

To attain the foregoing object, a semiconductor device according to the present invention comprises an island region which is surrounded by an insulator on a semiconductor substrate to isolate a semiconductor element disposed therein. The island region having a first semiconductor layer of a first conductivity type formed within the island region; a second semiconductor layer of a second conductivity type formed within the first semiconductor layer, the second semiconductor layer forming a pn junction at an interface with at least the first semiconductor layer to make up the semiconductor element together with the first semiconductor layer; and a third semiconductor layer formed between the first semiconductor layer and the insulator, having an impurity concentration lower than either the first semiconductor layer of the first conductivity type or the second semiconductor layer of the second conductivity type.

That is to say, the device forms a virtual PIN structure by the first, third, and second semiconductor layers. Herein, the third semiconductor layer may be formed of polycrystalline silicon or amorphous silicon. Furthermore, the third semiconductor layer may also be an intrinsic semiconductor layer. Moreover, the third semiconductor layer may be an apparent intrinsic semiconductor layer of compensating type having a low impurity concentration in which the doping concentration is $1\times10^{14}$ cm$^{-3}$ or less. In this case, it may be either p type or n type.

Additionally, a method for fabricating a semiconductor device according to the present invention fundamentally includes the steps of: bonding a first semiconductor substrate and a second semiconductor substrate with a first insulation film interposed therebetween; grinding and polishing the first semiconductor substrate to a predetermined thickness required for an element formation; forming a second insulation film for element-isolating use reaching the first insulation film at a predetermined location on the first semiconductor substrate side to thereby form an island element region by the first semiconductor substrate; and forming a semiconductor element within the island element region.

Accordingly, the first step includes a step of preparing a substantially intrinsic semiconductor substrate as the first semiconductor substrate, a step of forming a first semiconductor layer of a first conductivity type from a surface of the first semiconductor substrate after the bonding step, and a step of forming a second semiconductor layer of a second conductivity type within this first semiconductor layer to thereby form the semiconductor element together with the first semiconductor layer The first semiconductor layer forming step includes a step of setting a depth of the first semiconductor layer to keep an intrinsic region as a third semiconductor layer between the formed first semiconductor layer and the insulator. By doing so, the island element region includes a virtual PIN structure formed from the first semiconductor layer of first conductivity type, the third semiconductor layer of substantially intrinsic type and the second semiconductor layer of second conductivity type.

Alternatively, the method can include a step of preparing a first conductivity type semiconductor substrate provided with a substantially intrinsic semiconductor layer on a surface thereof as the first semiconductor substrate priorly to the bonding step. The substantially intrinsic semiconductor layer side of the first semiconductor substrate is bonded, in the bonding step, to the second semiconductor substrate through the insulator, and the first conductivity type semiconductor substrate of the first semiconductor substrate becomes the first semiconductor layer. In this case, a polycrystalline silicon or amorphous silicon layer of low impurity concentration may be employed as the substantially intrinsic semiconductor layer. Furthermore, it is acceptable to establish the substantially intrinsic semiconductor layer by bonding and polishing another intrinsic monocrystalline semiconductor substrate, and it is also acceptable to obtain this by epitaxial growth. Moreover, it is also acceptable to compensate a carrier on the first conductivity type semiconductor substrate surface by introducing second conductivity type impurities and thereby form a compensated area of an apparent intrinsic semiconductor layer as the substantially intrinsic semiconductor layer.

According to the present invention, an island region surrounded by an insulator is formed on a semiconductor substrate, and a semiconductor element is formed within this island region. A first semiconductor layer of a first conductive type is formed within this island region and a second semiconductor layer of a second conductive type is formed within this first semiconductor layer, and the foregoing semiconductor element is composed. Furthermore, a third semiconductor layer making up a virtual PIN structure together with the first semiconductor layer of first conductivity type and the second semiconductor layer of second conductivity type is formed between the first semiconductor layer and the insulator.

Herein, when high voltage is applied to the semiconductor element, a depletion layer is created in the third semiconductor layer corresponding to an I layer of the virtual PIN structure composed of the first, second, and third semiconductor layers, the high voltage applied to the semiconductor element is distributed within this depletion layer, and high breakdown voltage can be obtained for the semiconductor element.

In this case, it is sufficient to make a virtual PIN structure between the first and second semiconductor layers both making up the semiconductor element, and so it is possible to cause the third semiconductor layer to function as an electric-field-alleviating layer irrespective of whether the semiconductor element is p type or n type, and even where the voltage applied to the semiconductor element is of positive polarity or negative polarity.

Additionally, because high breakdown voltage of the element is imparted by providing a substantially intrinsic layer, it becomes possible to design the first semiconductor layer irrespective of conditions of breakdown voltage. That is to say, freedom is obtained in the impurity concentration and thickness thereof. This signifies reduced ON-state resistance and increased current-drive performance of the element. That is to say, even when the first semiconductor layer is designed so as to have a drift region an integral value in a depth direction of an impurity concentration of which is at least $1.5 \times 10^{12}$ cm$^{-2}$, it is possible to ensure a sufficient breakdown voltage of the element, and increased current-drive performance of the element is obtained.

Moreover, because the third semiconductor layer is made to correspond to the foregoing I layer, even in a case where two semiconductor elements of differing conductivity types are formed on the same semiconductor substrate, the same third semiconductor can be caused to function as an electric-field-alleviating layer for the two semiconductor elements, irrespective of their conductive types.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Embodiments according to the present invention will be described hereinafter with reference to the drawings.
(First Embodiment)

Figure 1:
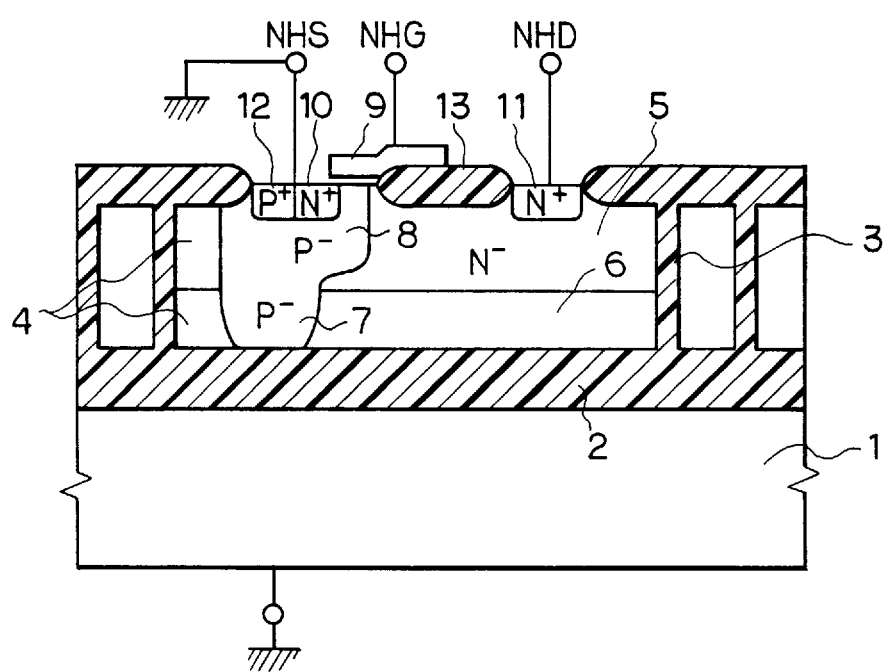
FIG. 1 is a sectional view indicating a first embodiment according to the present invention.

FIG. 1 indicates a structure of an n-channel high breakdown voltage LDMOS (lateral double-diffused MOS) formed in an SOI structure.

In this FIG. 1, a buried Si oxide film 2 is formed on a Si substrate 1, and a Si island layer (SOI layer) 4 is formed thereabove. This Si island layer 4 is isolated from the Si substrate 1 by the Si oxide film 2, and moreover is formed in isolation from another element region in a lateral direction by a Si oxide film 3, structuring an island region for semiconductor-element formation.

Accordingly, an electric-field-alleviating layer 6 of low impurity concentration is formed in a region within this Si island layer 4 adjacent to the Si oxide film 2. This electric-field-alleviating layer 6 has a thickness of 1 µm or more and an impurity concentration of B (boron) or P (phosphorus) or As (arsenic) or Sb (antimony) of $1\times10^{14}$ cm$^{-3}$ or less—i.e., a semiconductor layer which is an intrinsic semiconductor of an exceedingly low impurity concentration. Additionally, the Si oxide films 2 and 3 are of a thickness of 0.5 µm or more.

An N$^-$ layer 5 of an upper portion of the Si island layer 4 serves as a drift layer of the high breakdown voltage transistor. This drift layer 5 is a high-resistance layer and so is a low impurity concentration layer, but the impurity concentration thereof is established to be higher than the foregoing electric-field-alleviating layer 6. A P$^-$ layer 7 is a p well extending from the surface of the Si layer 4 to the electric-field-alleviating layer 6, and similarly a P$^-$ layer 8 is a channel p well existing in a location which is self-aligning with respect to a gate 9. Furthermore, an N$^+$ layer 10 within the P$^-$ layer 8 formes a source of the transistor, an N$^+$ layer 11 in the N$^-$ layer 5 formes a drain of the transistor together with the drift region 5, and a P$^+$ layer 12 within the P$^-$ layer 8 is a diffusion layer for obtaining the p-well potential. Additionally, a LOCOS oxide film 13 for electric-field alleviation is formed between the drain 11 and the p wells. The source 10 of the high breakdown voltage LDMOS transistor and the Si substrate 1 are structured equipotentially.

Moreover, the "N" of NHS, NHG, and NHD indicates "n-channel type"("P" to be described later indicates "p-channel type"), "H" indicates a case where positive-polarity voltage is applied ("L" indicates a case where negative-polarity voltage is applied), and "S," "G," and "D" indicate "source," "gate," and "drain," respectively.

According to the above-described structure, the electric-field-alleviating layer 6 is a semiconductor layer with an exceedingly low impurity concentration, and so a virtual PIN structure is structured by the p wells 7 and 8 (p-type layers) and the electric-field-alleviating layer 6 and drain regions 5 and 11 (n-type layers). Consequently, in a case where high voltage is applied between the source 10 and drain 11, a depletion layer is created in the electric-field-alleviating layer 6, and high voltage applied laterally between the source 10 and drain 11 comes to be distributed in this depletion layer.

Meanwhile, high voltage applied vertically between the drain 11 and Si substrate 1 is distributed and supported by the depleted electric-field-alleviating layer 6 and Si oxide film 2, and as a result, voltage applied to the thin electric-field-alleviating layer 6 comes to be markedly reduced.

Consequently, high breakdown voltage of the element is imparted by providing the electric-field-alleviating layer 6 of low impurity concentration at the Si oxide film 2 interface of the bottom portion of the Si island layer 4. Also, because the drift layer 5 of the high breakdown voltage transistor can be set to be of comparatively high concentration, breakdown voltage can be improved while maintaining the ON-state resistance when the transistor has been switched on at low resistance.

Additionally, with respect to the structure indicated in FIG. 1, high breakdown voltage can be imparted in a case of negative polarity with the source 10 connected to a negative power source, similarly to the above-described case. Similar application in a p-channel high breakdown voltage LDMOS transistor with the p and n exchanged is also possible.

When the potential of the Si substrate 1 under the Si oxide film 2 is "ground," the above-described electric-field alleviation is particularly effective in a case of a negative-polarity source of an n-channel transistor connected to a negative power source and in a case of a positive-polarity source of a p-channel transistor connected to a positive power source.

In this way, functioning as an electric-field-alleviating layer and high breakdown voltage can be imparted by providing the electric-field-alleviating layer 6, irrespective of whether an MOS transistor thereof is n type or p type, and even where negative-polarity voltage is applied.

Additionally, it is necessary to cause the electric-field-alleviating layer 6 to be a semiconductor layer of low impurity concentration, but it has been confirmed through experimentation that a breakdown voltage of 125 V or more is imparted where the impurity concentration thereof is $1\times10^{14}$ cm$^{-3}$ or less. That is to say, when the impurity concentration is $1\times10^{14}$ cm$^{-3}$ or less, a depletion layer expands sufficiently within the electric-field-alleviating layer 6 and the required breakdown voltage can adequately be obtained irrespective of whether the MOS transistor is p type or n type.

When the electric-field-alleviating layer 6 is caused to be an intrinsic semiconductor layer, the above-described structure can be caused to be a PIN structure, but when the impurity concentration thereof is $1\times10^{14}$ cm$^{-3}$ or less, the Fermi level is proximate to the essential center of the forbidden zone, and so a PIN structure substantially similar to the case of an intrinsic semiconductor can be obtained.

A method for fabricating the semiconductor device indicated in FIG. 1 will be described next with reference to FIGS. 2A to 2D.

Figure 2A:
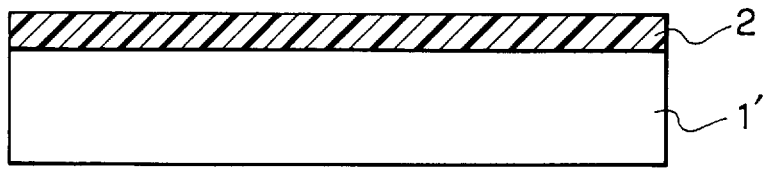
FIGS. 2A through 2D are sectional views indicating a method for fabricating the semiconductor device shown in FIG. 1.

First, a Si oxide film 2 is formed in a high-resistance FZ substrate or a CZ substrate in which an impurity concentration of B (boron) or P (phosphorus) or As (arsenic) or Sb (antimony) is less than $1\times10^{14}$ cm$^{-3}$—i.e., a semiconductor layer which is an intrinsic semiconductor of exceeding low impurity concentration. The Si oxide film 2 is formed to a thickness of 0.5 µm by thermal oxidation of a mirror-polished surface of a Si semiconductor substrate 1' having a (100) plane (FIG. 2A).

Next, a mirror-polished surface side of a p-type or n-type Si semiconductor substrate 1 having a (100) plane and the main-surface side of the Si semiconductor substrate 1' are joined in a clean state by a known direct-bonding process and made integral by heat treatment. At this time, a Si oxide film can be formed on the mirror-polished surface side of the Si semiconductor substrate 1 as well, for example, by a thermal-oxidation process or the like. That is to say, the Si oxide film 2 is formed on at least one or both of the Si semiconductor substrate 1 or Si semiconductor substrate 1'.

Figure 2B:
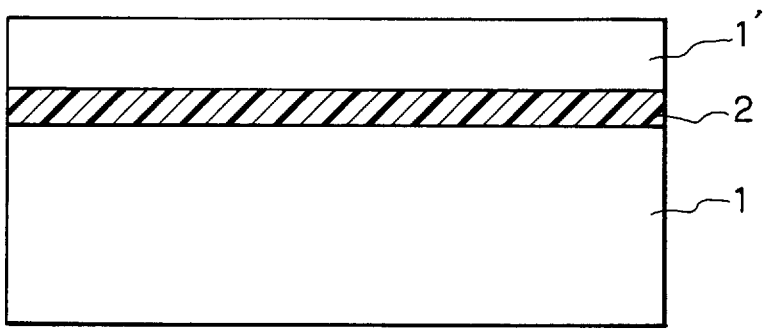

Grinding and polishing are performed from a surface on the side opposite the bonding surface of the Si semiconductor substrate 1' of this integrated substrate, causing the thickness of the Si semiconductor substrate 1' to be for example 10 µm to obtain a structure indicated in FIG. 2B.

Figure 2C:
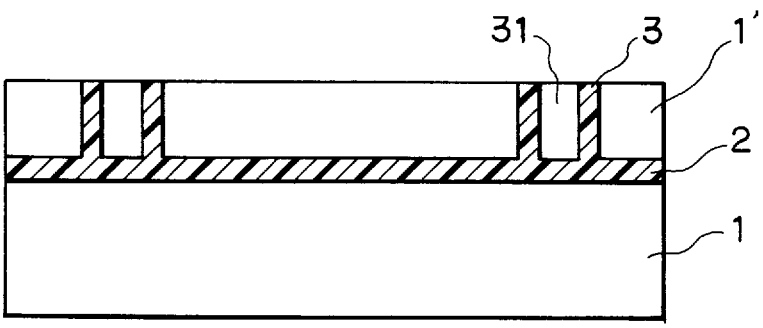

A Si oxide film is then formed on the Si semiconductor substrate 1', and a groove is formed by photolithography and dry etching. After a Si oxide film 3 of 0.5 µm or more is formed on side walls of the groove by for example a thermal-oxidation process or the like, polycrystalline Si is buried in the groove and the surface is flattened by grinding and polishing or by an etch-back process or the like (FIG. 2C).

Figure 2D:
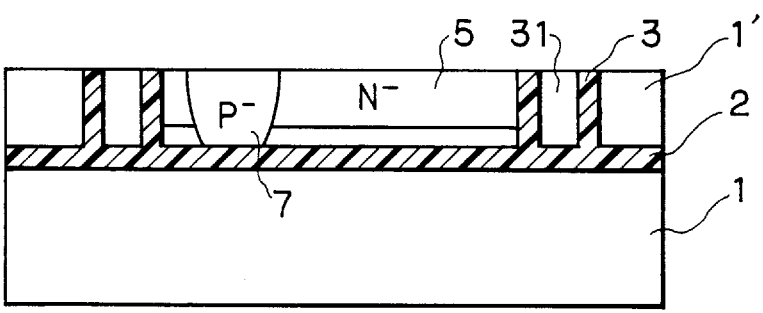

Thereafter, masking is performed, a P$^-$ layer 7, which will become a p well, and a drift layer 5 are formed in an element-region portion by ion-implanting and thermal diffusion (FIG. 2D).

Accordingly, known processes are employed to form a LOCOS oxide film 13, gate 9, channel p well 8, N$^+$ source and drain 10 and 11, and P⁺ layer 12, as well as electrodes, leads, surface-protection film, and so on, and the n-channel high breakdown voltage LDMOS transistor indicated in FIG. 1 is structured.

The above-described method was described as employing a low concentration semiconductor substrate which becomes the electric-field-alleviating layer 6 in the step (FIG. 2A), and thereafter forming the drift layer 5 in FIG. 2D. However, it is also acceptable to form both the substrate forming the drift layer 5 and the electric-field-alleviating layer 6 in step (FIG. 2A). This modification will be described hereinafter.

As a first modification, firstly an N⁻ Si semiconductor substrate corresponding to the concentration of the foregoing drift layer 5 is prepared, polycrystalline Si in which an impurity concentration of B (boron) or P (phosphorus) or As (arsenic) or Sb (antimony) is $1 \times 10^{14}$ cm⁻³ or less or an intrinsic of exceeding low impurity concentration is deposited to for example 5 µm on a mirror-polished surface of the Si semiconductor substrate, thereby.replacing the foregoing Si semiconductor substrate 1'. It is also acceptable to similarly deposit amorphous Si of low impurity concentration to for example 5 µm in substitution of the polycrystalline Si.

As a second modification, an N⁻ Si semiconductor substrate corresponding to the concentration of the foregoing drift layer 5 is prepared, another Si semiconductor substrate in which an impurity concentration of B (boron) or P (phosphorus) or As (arsenic) or Sb (antimony) is $1 \times 10^{14}$ cm⁻³ or less or an intrinsic of exceeding low impurity concentration is further prepared, and the mutual mirror-polished surfaces of the respective semiconductor substrates are bonded. After integration by heat treatment, grinding and polishing from a surface on a side opposite a bonding surface of the foregoing other Si semiconductor substrate are performed to obtain a thickness of for example 5 µm, thereby replacing the above-mentioned Si semiconductor substrate 1'.

As a third modification, an N⁻ Si semiconductor substrate corresponding to the concentration of the foregoing drift layer 5 is prepared, epitaxial monocrystalline Si in which an impurity concentration of B (boron) or P (phosphorus) or As (arsenic) or Sb (antimony) is $1 \times 10^{14}$ cm⁻³ or less or an intrinsic of exceeding low impurity concentration is deposited to for example 5 µm on a mirror-polished surface of the Si semiconductor substrate, thereby replacing the above-described Si semiconductor substrate 1'.

As a fourth modification, an N⁻ Si semiconductor substrate corresponding to the concentration of the foregoing drift layer 5 is prepared, impurities whose conductivity type is opposite to that of the Si semiconductor substrate, such as B (boron) or the like, are introduced to a mirror-polished surface of the Si semiconductor substrate by for example an ion-implantation method or a vapor-diffusion method or the like, and the carrier of the surface layer is compensated and caused to be $1 \times 10^{14}$ cm⁻³ or less, thereby replacing the above-described Si semiconductor substrate 1'.

In the foregoing various methods for fabricating, it is acceptable to exchange p and n to structure a p-channel high breakdown voltage LDMOS transistor. In that case, the N⁻ Si semiconductor substrate corresponding to the concentration of the drift layer 5 is caused to be a P⁻ Si semiconductor substrate. Additionally, it is sufficient if the electric-field-alleviating layer 6 is a low impurity concentration of $1 \times 10^{14}$ cm⁻³ or less, and in that case it is acceptable if the conductivity type thereof is either n or p.

(Second Embodiment)

Figure 3:
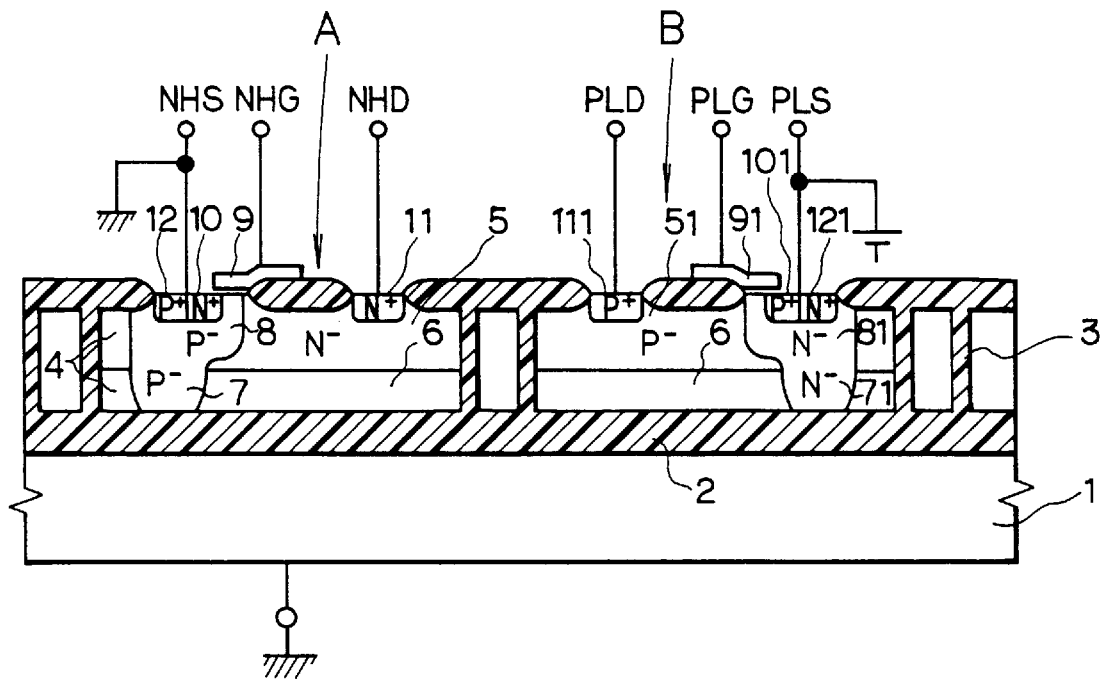
FIG. 3 is a sectional view indicating a second embodiment according to the present invention.

FIG. 3 indicates a structure wherein an n-channel high breakdown voltage LDMOS transistor A and similarly a p-channel high breakdown voltage LDMOS transistor B are formed within the same chip.

In this structure, a source 10 of the n-channel transistor A and a Si substrate 1 are equipotential at "ground," but the power-source voltage is applied to a source 101 of the p-channel transistor B, and potential differs from the Si substrate 1. In this case, an electric-field-alleviating layer 6 functions with further effectiveness in imparting high breakdown voltage for the p-channel transistor B.

Conversely, application is also possible in a case where the source 101 of the p-channel transistor B and the Si substrate 1 are equipotential at "ground," and a negative power source is applied to the source 10 of the n-channel transistor A. In this case, the electric-field-alleviating layer 6 functions with further effectiveness in imparting high breakdown voltage for the n-channel transistor A.

(Third Embodiment)

Figure 4:
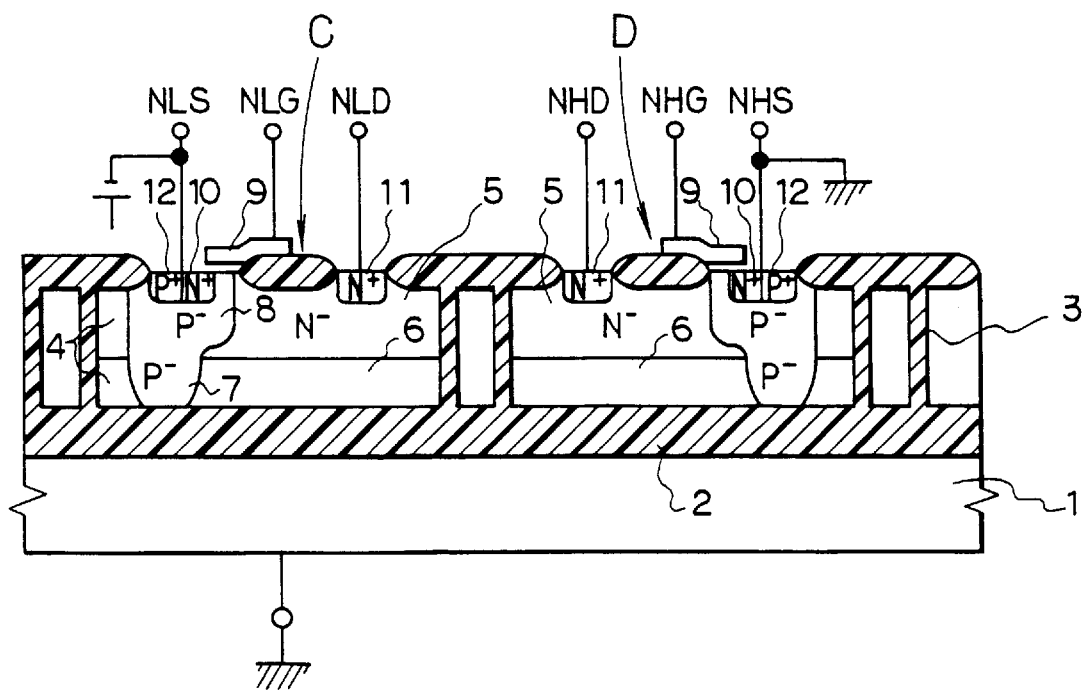
FIG. 4 is a sectional view indicating a third embodiment according to the present invention.

FIG. 4 indicates a structure wherein two n-channel high breakdown voltage LDMOS transistors C and D are formed in differing element regions within the same chip.

In this structure, a source 10 of the n-channel transistor D and a Si substrate 1 are equipotential at "ground," but negative power-source voltage is applied to a source 10 of the n-channel transistor C, and potential differs from the Si substrate 1. In this case, an electric-field-alleviating layer 6 functions with further effectiveness in imparting high breakdown voltage for the n-channel transistor C.

Application is similarly possible when two p-channel high breakdown voltage LDMOS transistors are similarly formed in differing element regions within the same chip. In this case, electric-field-alleviating layer 6 functions with further effectiveness to imparting high breakdown voltage for the high breakdown voltage transistor in which the source is connected to the positive power-source voltage.

(Fourth Embodiment)

Figure 5:
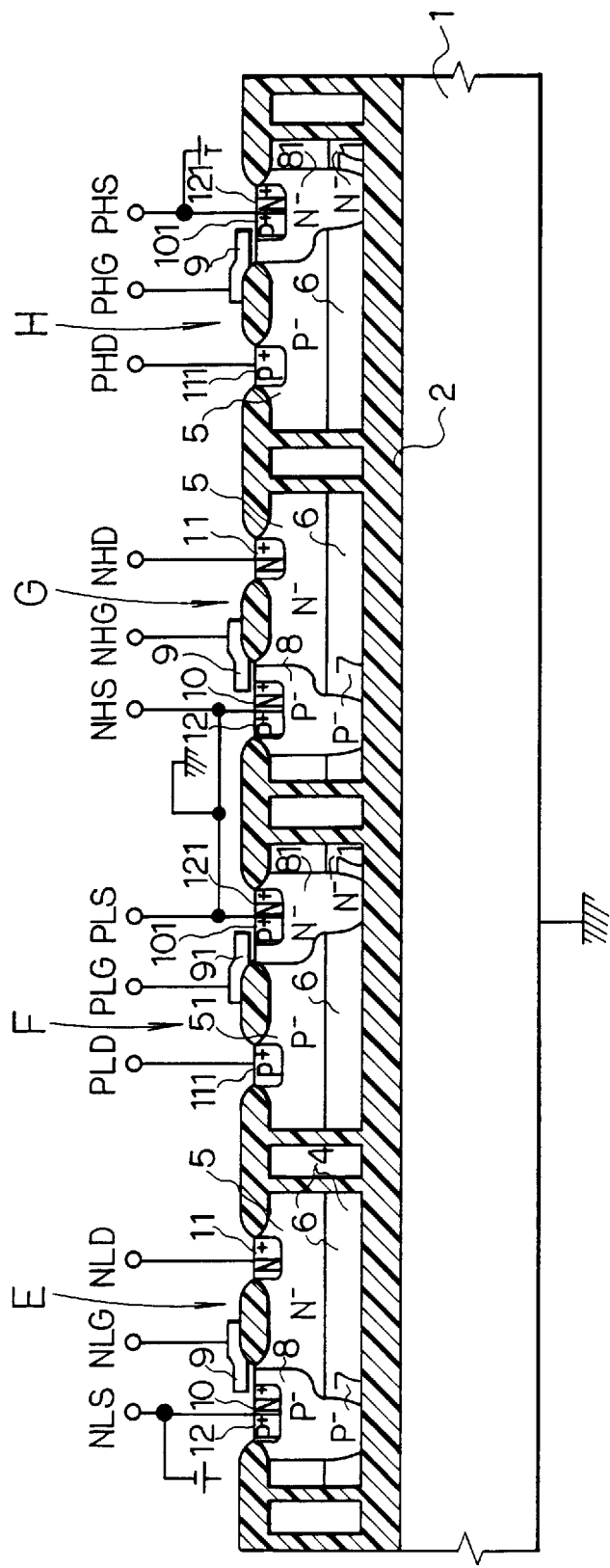
FIG. 5 is a sectional view indicating a fourth embodiment according to the present invention.

FIG. 5 indicates a structure wherein an n-channel high breakdown voltage LDMOS transistor E and a p-channel high breakdown voltage LDMOS transistor F and further an n-channel high breakdown voltage LDMOS transistor G and a p-channel high breakdown voltage LDMOS transistor H are formed within the same chip.

In this structure, a source 10 of the n-channel transistor G, a source 101 of the p-channel transistor F, and a Si substrate 1 are equipotential at "ground," but negative power-source voltage is applied to a source 10 of the n-channel transistor E and positive power-source voltage is applied to a source 101 of the p-channel transistor H, and each potential differs from the Si substrate 1. In this case, an electric-field-alleviating layer 6 functions with further effectiveness in imparting high breakdown voltage for both the n-channel transistor E and the p-channel transistor H.

(Fifth Embodiment)

Figure 6:
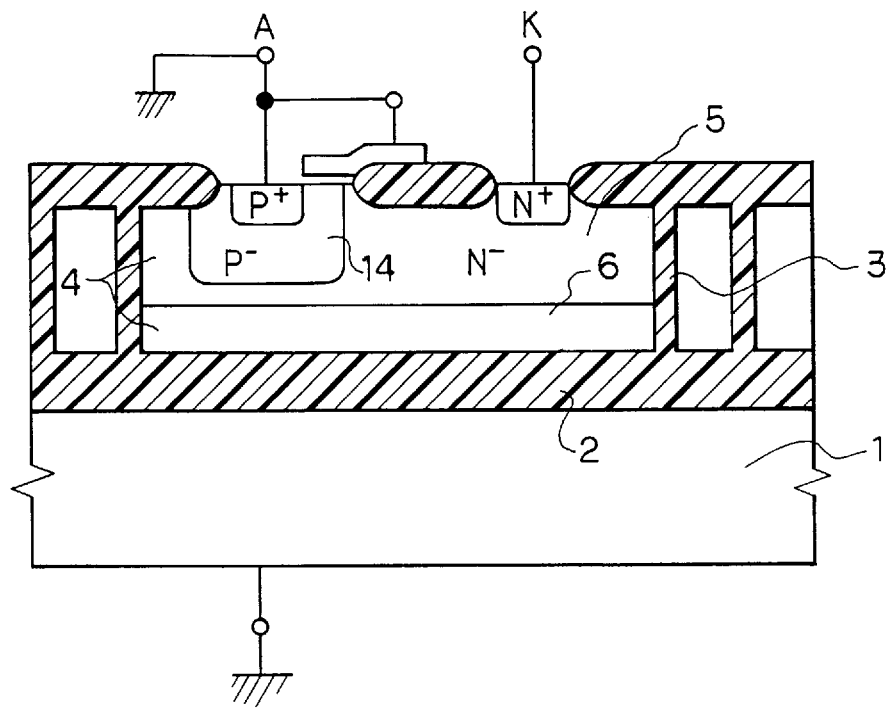
FIG. 6 is a sectional view indicating a fifth embodiment according to the present invention.

FIG. 6 indicates a high breakdown voltage PN diode formed in an SOI structure. Similarly to the embodiment indicated in FIG. 1, an Si island layer 4 is formed, and an electric-field-alleviating layer 6 is formed in a region within this Si island layer 4 adjacent to the Si oxide film 2, similar to the first embodiment. Herein, an N⁻ layer 5 of an upper portion of the Si island layer 4 is an N layer of a high breakdown voltage diode, and a P⁻ layer 14 is a P layer of a diode formed from the surface of the Si island layer 4 toward the electric-field-alleviating layer 6. As shown in the drawing, it is acceptable if this P⁻ layer 14 does not necessarily reach the electric-field-alleviating layer 6. This is because, when a voltage is reverse biased across the pn junction, a depletion layer extending from the pn junction to the N⁻ layer 5 reaches within the electric-field-alleviating layer 6 and expands therewithin, and a function of electric-field alleviation is exhibited. Of course, like the above embodiments, the P⁻ layer 14 may be formed to reach the electric-field-alleviating layer 6.

In the above-described embodiments, the electric-field-alleviating layer 6 may be formed of either polycrystalline silicon or amorphous silicon.

Figure 7:
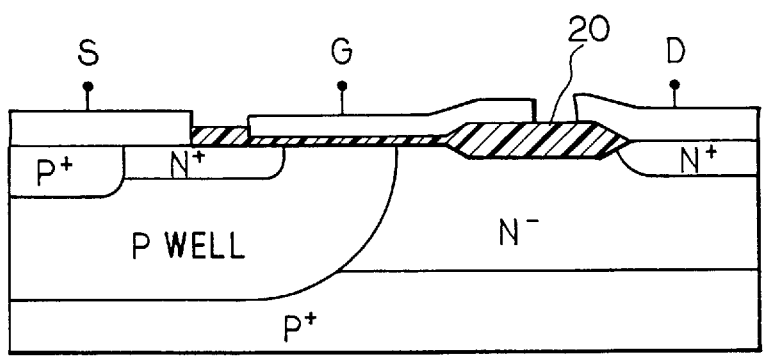
FIG. 7 is a sectional view indicating a conventional structure.
Figure 8:
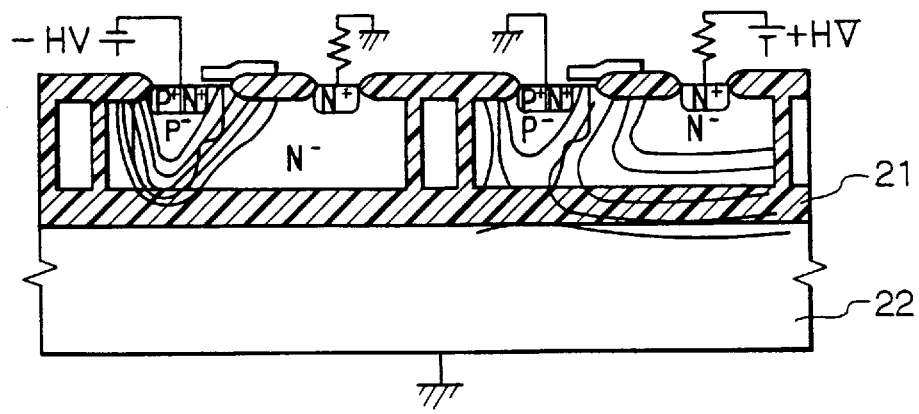
FIG. 8 is an explanatory diagram to describe a problem in a MOS transistor of SOI structure lacking an electric-field-alleviating layer.
Figure 9:
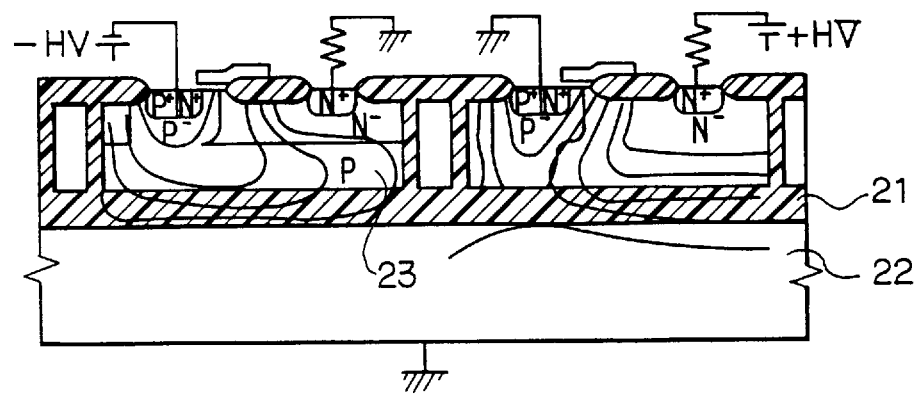
FIG. 9 is an explanatory diagram to describe a problem in a case where an electric-field-alleviating layer is simply inserted into the structure indicated in FIG. 8.

In the conventional high breakdown voltage LDMOS transistor shown in FIGS. 7 and 9, surface electric field is alleviated by providing a P layer below an N⁻ drift layer and by fully-depleting the N⁻ drift layer. In this arrangement, because the breakdown voltage is supported by the pn junction between the N⁻ drift layer and the underlying P layer, it is necessary for the N⁻ drift layer to be fully depleted, and to thereby be designed such that the integral value in a depth direction of an impurity concentration thereof should be less than $1.5 \times 10^{12}$ cm$^{-2}$. Because of this restriction, heavy current cannot be expected in the conventional LDMOS.

On the other hand, according to the above described embodiments, because the electric-field-alleviating layer 6 provided below the drift region 5 has a low impurity concentration, or less than $1 \times 10^{14}$ cm$^{-3}$ or an intrinsic, breakdown voltage of the element is imparted by a voltage between the p well 7 and the electric-field-alleviating layer 6. Consequently, even when the N⁻ drift region 5 is designed such that the integral value in a depth direction of an impurity concentration thereof is $1.5 \times 10^{12}$ cm$^{-2}$ or more, it is possible to ensure a sufficient breakdown voltage of the element, and increased current-drive performance of the element is obtained. In other words, according to the embodiments, it becomes possible to design the drift region irrespective of conditions of breakdown voltage. This signifies that, freedom is obtained in the impurity concentration and thickness thereof, and reduced ON-state resistance and increased current-drive performance of the element are obtained.

Herein, the above integral value in a depth direction x of an impurity concentration, ND, is given by the expression:

$$ND = \int_0^{x_j} N \cdot dx$$

wherein N expresses an impurity concentration of the N drift region 5, $X_j$ expresses a depth of the N drift region 5, i.e., thickness from the surface of the drift region to the interface with the electric-field-alleviating layer 6.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device, comprising:
   an island region surrounded by an insulator on a semiconductor substrate, a semiconductor element being formed within said island region,
   said island region including:
      a first semiconductor layer of a first conductivity type formed within said island region, an integral value of an impurity concentration in a depth direction of said first semiconductor layer being at least $1.5 \times 10^{12}$ cm$^{-2}$;
      a second semiconductor layer of a second conductivity type formed within said first semiconductor layer, making up said semiconductor element together with said first semiconductor layer, and forming a pn junction at an interface with at least said first semiconductor layer;
   a first terminal, connected to said first semiconductor layer, for receiving a first predetermined voltage applied thereto;
   a second terminal, connected to said second semiconductor layer, for receiving a second predetermined voltage applied thereto, a potential difference between said first and second predetermined voltages being such that said pn junction is reverse biased; and
      a third semiconductor layer formed between said first semiconductor layer and said insulator, said third semiconductor layer being of the same semiconductor material as said first semiconductor layer, formed continuously therewith, having the same crystalline condition as said first semiconductor layer and having an impurity concentration of $1 \times 10^{14}$ cm$^{-3}$ or less, the impurity concentration of said third semiconductor layer being lower than that of said first semiconductor layer, said third semiconductor layer being connected to said first semiconductor layer to form an N-I junction therewith and being connected to the second semiconductor layer to form a P-I junction therewith;
   wherein a depletion layer is formed in said third semiconductor layer by applying said first predetermined voltage and said second predetermined voltage to said first and second terminals, respectively.

2. A semiconductor device according to claim 1, wherein said second semiconductor layer is provided with a fourth semiconductor layer of said first conductivity type, and said fourth semiconductor layer serves as a source or drain of a MOS transistor as said first semiconductor element while said first semiconductor layer serves as a drain or source of said MOS transistor.

3. A semiconductor device according to claim 1, wherein said first semiconductor layer and said second semiconductor layer form up a pn diode as said semiconductor element.

4. A semiconductor device according to claim 1, wherein said third semiconductor layer is an intrinsic semiconductor layer.

5. A semiconductor device according to claim 1, wherein said second semiconductor layer has a depth which reaches said third semiconductor layer.

6. A semiconductor device according to claim 1, further comprising:
   a fourth semiconductor layer of the first conductivity type formed in the surface of said first conductivity layer, said fourth semiconductor layer being separate from said third semiconductor layer;
   wherein an impurity concentration of said fourth semiconductor layer being higher than that of said first semiconductor layer; and
   wherein said second semiconductor layer has a depth which reaches said third semiconductor layer.

7. A semiconductor device according to claim 1, wherein said third semiconductor layer is electrically separated from an adjacent island region by said insulator.

8. A semiconductor device comprising:
   a first island region -and a second island region, each being surrounded by an insulator on a semiconductor substrate, a first semiconductor element and a second semiconductor element being respectively formed within said first and second island regions;

a first semiconductor layer of a first conductivity type formed within said first island region, an integral value of an impurity concentration in a depth direction of said first semiconductor layer being at least $1.5 \times 10^{12}$ cm$^{-2}$;

a second semiconductor layer of a second conductivity type formed within said first semiconductor layer, making up said first semiconductor element together with said first semiconductor layer, and forming a pn juction at an interface with at least said first semiconductor layer;

a first terminal, connected to said first semiconductor layer, for receiving a first predetermined voltage applied thereto;

a second terminal, connected to said second semiconductor layer, for receiving a second predetermined voltage applied thereto, a potential difference between said first and second predetermined voltages being such that said pn junction is reverse biased;

a fourth semiconductor layer of said second conductivity type formed within said second island region;

a fifth semiconductor layer of said first conductivity type formed within said fourth semiconductor layer, making up said second semiconductor element together with said fourth semiconductor layer, and forming a pn junction at an interface with at least said fourth semiconductor layer; and a third semiconductor layer formed from the same semiconductor material as said first semiconductor layer, being formed continuosly therewith, having the same crystalline condition as said first semiconductor layer and having and impurity concentration of $1 \times 10^{14}$ cm$^{-3}$ or less and provided respectively between said first semiconductor layer and said insulator and between said fourth semiconductor layer and said insulator;

wherein the impurity concentration of said third semiconductor layer is lower than that of said first semiconductor layer;

said third semiconductor layer is connected to said first semiconductor layer to form an N-I junction therewith and is connected to said second semiconductor layer to form a P-I junction therewith; and a depletion layer is formed in said third semiconductor layer by applying said first predetermined voltage and second predetermined voltage to said first and second terminals, respectively.

9. A semiconductor device according to claim 8, wherein said second semiconductor layer is provided with a sixth semiconductor layer of said first conductivity type, and said sixth semiconductor layer serves as a source or drain of a first MOS transistor as said first semiconductor element while said first semiconductor layer serves as a drain or source of said first MOS transistor.

10. A semiconductor device according to claim 8, wherein said fifth semiconductor layer is provided with a seventh semiconductor layer of said second conductivity type, and said seventh semiconductor layer serves as a source or drain of a second MOS transistor as said first semiconductor element while said fourth semiconductor layer serves as a drain or source of said second MOS transistor.

11. A semiconductor device according to claim 8, wherein said fourth semiconductor layer includes a second drift region an integral value in a depth direction of an impurity concentration of which is at least $1.5 \times 10^{12}$ cm$^{-2}$.

12. A semiconductor device according to claim 8, wherein said third semiconductor layer is an intrinsic semiconductor layer.

13. A semiconductor device comprising:

an island region surrounded by an insulator on a semiconductor substrate, a semiconductor element being formed within said island region, said island region including:

a first semiconductor layer of a first conductivity type formed within said island region;

a second semiconductor layer of a second conductivity type formed within said first semiconductor layer, making up said semiconductor element together with said first semiconductor layer, and forming a pn junction at an interface with at least said first semiconductor layer;

a first terminal, connected to said first semiconductor layer, for receiving a first predetermined voltage applied thereto;

a second terminal, connected to said second semiconductor layer, for receiving a second predetermined voltage applied thereto, a potential difference between said first and second predetermined voltages being such that said pn junction is reverse biased; and a third semiconductor layer formed between said first semiconductor layer and said insulator, said third semiconductor layer being of the same semiconductor material as said first semiconductor layer, being formed continuously therewith, having the same crystalline condition and having an impurity concentration of $1 \times 10^{14}$ cm$^{-3}$ or less, which is lower than an impurity concentration of said first semiconductor layer;

wherein the impurity concentration of said third semiconductor layer is lower than that of said first semiconductor layer, said third semiconductor layer is connected to said first semiconductor layer to form an N-I junction therewith and is connected to said second semiconductor layer to form a P-I junction therewith;

a depletion layer is formed in said third semiconductor layer by applying said first predetermined voltage and said second predetermined voltage to said first and second terminals, respectively; and said third semiconductor layer alleviates an electric field in said semiconductor element.

14. A semiconductor device according to claim 13, wherein said second semiconductor layer is provided with a fourth semiconductor layer of said first conductivity type, and said fourth semiconductor layer serves as a source or drain of an MOS transistor as said semiconductor element while said first semiconductor layer serves as a drain or source of said MOS transistor.

15. A semiconductor device according to claim 13, wherein said first semiconductor layer and said second semiconductor layer makes up a pn diode as said semiconductor element.

16. A semiconductor device according to claim 13, wherein said first semiconductor layer includes a drift region having an integral value.of an impurity concentration in a depth direction of at least $1.5 \times 10^{12}$ cm$^{12}$.

17. A semiconductor device according to claim 13, wherein said third semiconductor layer is an intrinsic semiconductor layer.

18. A semiconductor device according to claim 13, wherein said second semiconductor layer has a depth which reaches said third semiconductor layer.

19. A semiconductor device according to claim 13, further comprising:

a fourth semiconductor layer of the first conductivity type formed in the surface of said first conductivity layer, said fourth semiconductor layer being separate from said third semiconductor layer;

wherein an impurity concentration of said fourth semiconductor layer is higher than that of said first semiconductor layer; and said second semiconductor layer has a depth which reaches said third semiconductor layer.

20. A semiconductor device according to claim 13, wherein said third semiconductor layer is electrically separated from an adjacent island region by said insulator.

21. A semiconductor device comprising:

a first island region and a second island region, each being surrounded by an insulator on a semiconductor substrate, a first semiconductor element and a second semiconductor element being respectively formed within said first and second island regions;

a first semiconductor layer of a first conductivity type formed within said first island region;

a second semiconductor layer of a second conductivity type formed within said first semiconductor layer, making up said first semiconductor element together with said first semiconductor layer, and forming a pn junction at an interface with at least said first semiconductor layer;

a first terminal, connected to said first semiconductor layer, for receiving a first predetermined voltage applied thereto;

a second terminal, connected to said second semiconductor layer, for receiving a second predetermined voltage applied thereto, a potential difference between said first and second predetermined voltages being such that said pn junction is reverse biased;

a fourth semiconductor layer of said second conductivity type formed within said second island region;

a fifth semiconductor layer of said first conductivity type formed within said fourth semiconductor layer, making up said second semiconductor layer together with said fourth semiconductor layer, and forming a pn junction at an interface with at least said fourth semiconductor layer; and a third semiconductor layer of the same semiconductor material as said first semiconductor layer, having the same crystalline condition, being formed continuously with said first semiconductor layer and having an impurity concentration of $1 \times 10^{14}$ cm$^{-3}$ or less, which is lower than an impurity concentration of said first semiconductor layer, and provided respectively between said first semiconductor layer and said insulator and between said fourth semiconductor layer and said insulator, wherein the impurity concentration of said third semiconductor layer is lower than that of said first semiconductor layer;

said third semiconductor layer is connected to said first semiconductor layer to form an N-I junction therewith and is connected to said second semiconductor layer to form a P-I junction therewith; and a depletion layer is formed in said third semiconductor layer by applying said first predetermined voltage and said second predetermined voltage to said first and second terminals, respectively.

22. A semiconductor device according to claim 21, wherein said semiconductor element is a MOS transistor and said second semiconductor layer is provided with a sixth semiconductor layer of said first conductivity type which serves as a source or drain of said first MOS transistor, while said first semiconductor layer serves as a drain or source of said first MOS transistor.

23. A semiconductor device according to claim 22, wherein said semiconductor element is a MOS transistor and said fifth semiconductor layer is provided with a seventh semiconductor layer of said second conductivity type which serves as a source or drain of a second MOS transistor, while said fourth semiconductor layer serves as a drain or source of said second MOS transistor.

24. A semiconductor device according to claim 21, wherein each of said first and fourth semiconductor layers includes a drift region having an integral value of an impurity concentration in a depth direction of at least $1.5 \times 10^{12}$ cm$^{-2}$.

25. A semiconductor device according to claim 21, wherein said third semiconductor layer is an intrinsic semiconductor layer.

26. A semiconductor device according to claim 21, wherein said impurity concentration of said third semiconductor layer is lower than an impurity concentration of said fourth semiconductor layer, thereby alleviating an electric field in said second semiconductor element.

27. A semiconductor device according to claim 21, wherein said second semiconductor layer has a depth which reaches said third semiconductor layer.

28. A semiconductor device according to claim 27, wherein said fifth semiconductor layer has a depth which reaches said third semiconductor layer. with said first semiconductor layer, and forming a pn junction at an interface with at least said first semiconductor layer;

a first terminal, connected to said first semiconductor layer, for receiving a first predetermined voltage applied thereto;

a second terminal, connected to said second semiconductor layer, for receiving a second predetermined voltage applied thereto, a potential difference between said first and second predetermined voltages being such that said pn junction is reverse biased;

a fourth semiconductor layer of said second conductivity type formed within said second island region;

a fifth semiconductor layer of said first conductivity type formed within said fourth semiconductor layer, making up said second semiconductor element together with said fourth semiconductor layer, and forming a pn junction at an interface with at least said fourth semiconductor layer; and a third semiconductor layer formed from the same semiconductor material as said first semiconductor layer, being formed continuously therewith, having the same crystalline condition as said first semiconductor layer and having an impurity concentration of $1 \times 10^{14}$ cm$^{-3}$ or less and provided respectively between said first semiconductor layer and said insulator and between said fourth semiconductor layer and said insulator;

wherein the impurity concentration of said third semiconductor layer is lower than that of said first semiconductor layer;

said third semiconductor layer is connected to said first semiconductor layer to form an N-I junction therewith and is connected to said second semiconductor layer to form a P-I junction therewith; and a depletion layer is formed in said third semiconductor layer by applying said first predetermined voltage and said second predetermined voltage to said first and second terminals, respectively.

29. A semiconductor device according to claim 22, wherein said third semiconductor layer is formed beneath said first semiconductor layer is formed beneath said first semiconductor layer and said second semiconductor layer.

30. A semiconductor device according to claim 22, wherein said second semiconductor layer and said fifth semiconductor layer are expandable to said third semiconductor layer.

31. A semiconductor device according to claim 21, further comprising an eighth semiconductor layer of the same semiconductor material as said fourth semiconductor layer, having the same crystalline condition, and being formed continuously with said fourth semiconductor layer.

32. A semiconductor device according to claim 31, further comprising:
a plurality of island regions each surrounded by an insulator on a semiconductor substrate with said first and second island regions; and
a plurality of semiconductor elements each being respectively formed within one of said plurality of island regions, and each having a structure identical to that of said first and second semiconductor elements;
said third semiconductor layer and said eighth semiconductor layer being formed between layers in said plurality of semiconductor elements in said plurality of island regions identically as in said first and second island regions, respectively.

33. The semiconductor device of claim 21, wherein said impurity concentration of said third semiconductor layer is also lower than that of said fourth layer.

34. A semiconductor element, comprising:
a semiconductor substrate;
an insulating layer formed on said semiconductor substrate and defining an island region in which said semiconductor element is formed;
a first semiconductor layer of a first conductivity type formed within said island region;
a second semiconductor layer of a second conductivity type formed within said first semiconductor layer and forming a pn junction at an interface with at least said first semiconductor layer;
a first terminal, connected to said first semiconductor layer, for receiving a first predetermined voltage applied thereto;
a second terminal, connected to said second semiconductor layer, for receiving a second predetermined voltage applied thereto, a potential difference between said first and second predetermined voltages being such that said pn junction is reverse biased; and
a third semiconductor layer formed between said first semiconductor layer and said insulator and below said first semiconductor layer, said third semiconductor layer being of the same semiconductor material as the first semiconductor layer, being formed continuously therewith, having the same crystalline condition and having an impurity concentration which is lower than an impurity concentration of said first semiconductor layer,
wherein said third semiconductor layer is connected to said first semiconductor layer to form an N-I junction therewith and to said second semiconductor layer to form a P-I junction therewith;
a depletion layer is formed in said third semiconductor layer by applying said first predetermined voltage and said second predetermined voltage to said first and second terminals, respectively; and said third semiconductor layer alleviates an electric field in said semiconductor element.

35. A semiconductor device according to claim 34, further comprising:
a fourth semiconductor layer of the first conductivity type formed in the surface of said first conductivity layer, said fourth semiconductor layer being separate from said third semiconductor layer;
wherein an impurity concentration of said fourth semiconductor layer is higher than that of said first semiconductor layer; and
said second semiconductor layer has a depth which reaches said third semiconductor layer.

36. A semiconductor device according to claim 34, wherein said third semiconductor layer is electrically separated from an adjacent island region by said insulator.

37. A semiconductor device, comprising:
an island region surrounded by an insulator on a semiconductor substrate, a semiconductor element being formed within said island region,
said island region including:
a first semiconductor layer of a first conductivity type formed within said island region, an integral value of an impurity concentration in a depth direction of said first semiconductor layer being at least $1.5\times10^{12}$ cm$^{-3}$;
a second semiconductor layer of a second conductivity type formed within said first semiconductor layer, making up said semiconductor element together with said first semiconductor layer, and forming a pn junction at an interface with at least said first semiconductor layer;
a first terminal, connected to said first semiconductor layer, for receiving a first predetermined voltage applied thereto;
a second terminal, connected to said second semiconductor layer, for receiving a second predetermined voltage applied thereto, a potential difference between said first and second predetermined voltages being such that said pn junction is reversed biased; and
a third semiconductor layer formed between said first semiconductor layer and said insulator, said third semiconductor layer being of the same semiconductor material as said first semiconductor layer formed from one of polycrystalline silicon and amorphous silicon and having an impurity concentration of $1\times10^{14}$ cm$^{-3}$ or less, the impurity concentration of said third semiconductor layer being lower than that of said first semiconductor layer, said third semiconductor layer being connected to said first semiconductor layer to form an N-I junction therewith and being connected to the second semiconductor layer to form a P-I junction therewith;
wherein a depletion layer is formed in said third semiconductor layer by applying said first predetermined voltage and said second predetermined voltage to said first and second terminals, respectively.

38. A semiconductor device comprising:
an island region surrounded by an insulator on a semiconductor substrate, a semiconductor element being formed within said island region,
said island region including:
a first semiconductor layer of a first conductivity type formed within said island region;
a second semiconductor layer of a second conductivity type formed within said first semiconductor layer, making up said semiconductor element together with said first semiconductor layer, and forming a pn junction at an interface with at least said first semiconductor layer;

a first terminal, connected to said first semiconductor layer, for receiving a first predetermined voltage applied thereto;

a second terminal, connected to said second semiconductor layer, for receiving a second predetermined voltage applied thereto, a potential difference between said first and second predetermined voltages being such that said pn junction is reverse biased; and a third semiconductor layer formed between said first semiconductor layer and said insulator, said third semiconductor layer being of the same semiconductor material as said first semiconductor layer formed from one of polycrystalline silicon and amorphous silicon and having an impurity concentration of $1\times10^{14}$ cm$^{-3}$ or less, which is lower than an impurity concentration of said first semiconductor layer;

wherein the impurity concentration of said third semiconductor layer is lower than that of said first semiconductor layer, said third semiconductor layer is connected to said first semiconductor layer to form an N-I junction therewith and is connected to said second semiconductor layer to form a P$^{-3}$ junction therewith:

a depletion layer is formed in said third semiconductor layer by applying said first predetermined voltage and said second predetermined voltage to first and second terminals, respectively; and said third semiconductor layer alleviates and electric field in said semiconductor element.

39. A semiconductor device comprising:

a first island region and a second island region, each being surrounded by an insulator on a semiconductor substrate, a first semiconductor element and a second semiconductor element being respectively formed within said first and second island regions;

a first semiconductor layer of a first conductivity type formed within said first island region;

a second semiconductor layer of a second conductivity type formed within said first semiconductor layer, making up said first semiconductor element together with said first semiconductor layer, and forming a pn junction at an interface with at least said first semiconductor layer;

a first terminal, connected to said first semiconductor layer, for receiving a first predetermined voltage applied thereto;

a second terminal, connected to said second semiconductor layer, for receiving a second predetermined voltage applied thereto, a potential difference between said first and second predetermined voltages being such that said pn junction is reverse biased;

a fourth semiconductor layer of said second conductivity type formed within said second island region;

a fifth semiconductor layer of said first conductivity type formed within said fourth semiconductor layer, making up said second semiconductor layer together with said fourth semiconductor layer, and forming a pn junction at an interface with at least said fourth semiconductor layer; and a third semiconductor layer of the same semiconductor material as said first and fourth semiconductor layers formed from one of polycrystalline silicon and amorphous silicon and having an impurity concentration of $1\times10^{14}$ cm$^{-3}$ or less, which is lower than an impurity concentration of said first semiconductor layer, and provided respectively between said first semiconductor layer and said insulator and between said fourth semiconductor layer and said insulator, wherein the impurity concentration of said third semiconductor layer is lower than that of said first and fourth semiconductor layers;

said third semiconductor layer is connected to said first semiconductor layer to form an N-I junction therewith and is connected to said second semiconductor layer to form a P-I junction therewith; and a depletion layer is formed in said third semiconductor layer by applying said first predetermined voltage and second predetermined voltage to said first and second terminals, respectively.

* * * * *